(12) United States Patent
Lin et al.

(10) Patent No.: US 12,255,279 B2
(45) Date of Patent: Mar. 18, 2025

(54) LIGHT-EMITTING DIODE PACKAGE STRUCTURE AND MANUFACTURING METHOD THEREOF

(71) Applicant: Unimicron Technology Corp., Taoyuan (TW)

(72) Inventors: Wen-Yu Lin, Taichung (TW); Kai-Ming Yang, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 471 days.

(21) Appl. No.: 17/583,222

(22) Filed: Jan. 25, 2022

(65) Prior Publication Data
US 2023/0187598 A1 Jun. 15, 2023

(30) Foreign Application Priority Data
Dec. 14, 2021 (TW) .................... 110146669

(51) Int. Cl.
| | |
|---|---|
| H01L 33/64 | (2010.01) |
| H01L 25/075 | (2006.01) |
| H01L 33/22 | (2010.01) |
| H01L 33/48 | (2010.01) |
| H01L 33/62 | (2010.01) |

(52) U.S. Cl.
CPC ........ H01L 33/647 (2013.01); H01L 25/0753 (2013.01); H01L 33/22 (2013.01); H01L 33/483 (2013.01); H01L 33/62 (2013.01); H01L 2933/0066 (2013.01); H01L 2933/0075 (2013.01)

(58) Field of Classification Search
CPC ... H01L 33/647; H01L 25/0753; H01L 33/22; H01L 33/483; H01L 33/62; H01L 2933/0066

USPC .......................................................... 257/88
See application file for complete search history.

(56) References Cited

U.S. PATENT DOCUMENTS

| | | | |
|---|---|---|---|
| 8,933,473 B1 * | 1/2015 | Dubin ................. | H01L 21/486 |
| | | | 257/79 |
| 2013/0146933 A1 * | 6/2013 | Unosawa ............... | H01L 33/38 |
| | | | 438/26 |
| 2016/0056194 A1 * | 2/2016 | Rudmann ........ | H01L 27/14618 |
| | | | 257/432 |

FOREIGN PATENT DOCUMENTS

| | | |
|---|---|---|
| CN | 1731592 | 2/2006 |
| CN | 103151438 | 6/2013 |
| CN | 109755374 | 5/2019 |
| TW | 201616696 | 5/2016 |

(Continued)

OTHER PUBLICATIONS

"Office Action of Taiwan Counterpart Application", issued on Aug. 15, 2022, p. 1-p. 11.

Primary Examiner — Quoc D Hoang
(74) Attorney, Agent, or Firm — JCIPRNET

(57) ABSTRACT

A light-emitting diode package structure includes a heat dissipation substrate, a redistribution layer, and multiple light-emitting diodes. The heat dissipation substrate includes multiple copper blocks and a heat-conducting material layer. The copper blocks penetrate the heat-conducting material layer. The redistribution layer is disposed on the heat dissipation substrate and electrically connected to the copper blocks. The light-emitting diodes are disposed on the redistribution layer and are electrically connected to the redistribution layer. A side of the light-emitting diodes away from the redistribution layer is not in contact with any component.

5 Claims, 10 Drawing Sheets

(56) References Cited

FOREIGN PATENT DOCUMENTS

| TW | 201939700 | 10/2019 |
| TW | I722835 | 3/2021 |

\* cited by examiner

LIGHT-EMITTING DIODE PACKAGE STRUCTURE AND MANUFACTURING METHOD THEREOF

CROSS-REFERENCE TO RELATED APPLICATION

This application claims the priority benefit of Taiwanese application serial no. 110146669, filed on Dec. 14, 2021. The entirety of the above-mentioned patent application is hereby incorporated by reference herein and made a part of this specification.

BACKGROUND

Technical Field

The disclosure relates to a package structure, in particular to a light-emitting diode package structure and a manufacturing method thereof.

Description of Related Art

The general light-emitting diode (LED) package can be manufactured by two manufacturing methods. Manufacturing method 1: first, multiple LEDs formed on a wafer (native epitaxy substrate, e.g., sapphire wafer) are cut into individual LEDs together with the wafer, and then the individual LEDs are transferred to a temporary substrate or package casing by pick-and-place. When the LEDs are transferred to the package casing, die attach, wire bond, solder, and EMC filling processes are required to complete the process. Manufacturing method 2: first, the film seal material is used to protect the multiple LEDs formed on the wafer, followed by the redistribution layer (RDL) and solder ball mount, and then the final product is cut into individual packages.

However, the above process steps are complicated, and the pick-and-place process and the sealing process tend to cause die shift of the light-emitting diode chips. Furthermore, because the sealing film material is not easy to remove and may have light-absorbing properties, the efficiency of the light-emitting diode per unit area will also be affected, as well as the heat dissipation efficiency.

SUMMARY

The disclosure provides a light-emitting diode package structure and a manufacturing method thereof, capable of improving die shift, enhancing overall heat dissipation efficiency or increasing optical power output per unit area, and simplifying the manufacturing process.

The light-emitting diode package structure of the disclosure includes a heat dissipation substrate, a redistribution layer, and multiple light-emitting diodes. The heat dissipation substrate includes multiple copper blocks and a heat-conducting material layer. The copper blocks penetrate the heat-conducting material layer. The redistribution layer is disposed on the heat dissipation substrate and electrically connected to the copper blocks. The light-emitting diodes are disposed on the redistribution layer and electrically connected to the redistribution layer. A side of the light-emitting diodes away from the redistribution layer is not in contact with any component.

According to an embodiment of the disclosure, a surface of the heat-conducting, material layer facing the redistribution layer is flush with a surface of the copper blocks facing the redistribution layer, and a surface of the heat-conducting material layer away from the redistribution layer is flush with a surface of the copper blocks away from the redistribution layer.

According to an embodiment of the disclosure, the package structure further includes a circuit board and multiple conductive terminals. The circuit board is disposed on a surface of the heat dissipation substrate away from the redistribution layer. The redistribution layer is electrically connected to the circuit board through the copper blocks. The conductive terminals are disposed between the heat dissipation substrate and the circuit board, and connected to the copper blocks and the circuit board.

According to an embodiment of the disclosure, the light-emitting diodes have a first electrode and a second electrode. The first electrode and the second electrode are respectively electrically connected to the corresponding copper blocks through the redistribution layer.

According to an embodiment of the disclosure, a thickness of the copper blocks is from 1 μm to 200 μm.

According to an embodiment of the disclosure, the package structure further includes a protective casing. The protective casing is disposed on the redistribution layer and covers the light-emitting diodes. The protective casing is not in contact with the light-emitting diodes.

A manufacturing method of a light-emitting diode package structure of the disclosure includes the following steps. Multiple light-emitting diodes are formed on a first temporary substrate. A redistribution layer is formed on the light-emitting diodes to be electrically connected to the light-emitting diodes. A heat dissipation substrate is formed on the redistribution layer. The heat dissipation substrate includes multiple copper blocks and a heat-conducting material layer. The copper blocks penetrate the heat-conducting material layer and are electrically connected to the redistribution layer. A side of the light-emitting diodes away from the redistribution layer is not in contact with any component.

According to an embodiment of the disclosure, the manufacturing method further includes the following steps. A circuit board is provided to bond the heat dissipation substrate to the circuit board, and to electrically connect the redistribution layer to the circuit board through the copper blocks. A plurality of conductive terminals are formed between the heat dissipation substrate and the circuit board to connect the copper blocks and the circuit board.

According to an embodiment of the disclosure, the manufacturing method further includes the following steps, A protective casing is formed on the redistribution layer to cover the light-emitting diodes. The protective casing is not in contact with the light-emitting diodes.

According to an embodiment of the disclosure, the following step is included before the redistribution layer is formed on the light-emitting diodes. A protective layer is formed on the first temporary substrate to fill a gap between the light-emitting diodes, and to surround each of the light-emitting diodes.

According to an embodiment of the disclosure, the following steps are included before the circuit board is provided. A second temporary substrate is disposed on a surface of the heat dissipation substrate away from the redistribution layer. The first temporary substrate is removed to expose a surface of the light-emitting diodes away from the redistribution layer. The second temporary substrate is removed to expose the surface of the heat dissipation substrate. The protective layer is removed.

According to an embodiment of the disclosure, the following step is included before the second temporary substrate is removed. The surface of the light-emitting diodes is roughened.

Based on the above, in the light-emitting diode package structure and the manufacturing method thereof according to an embodiment of the disclosure, by disposing the heat dissipation substrate between the redistribution layer and the circuit board, the heat generated by the light-emitting diode under high current operation may be quickly dissipated through the heat dissipation substrate to enhance the overall heat dissipation efficiency. In addition, because the manufacturing method according to this embodiment does not have the step of mass transfer and sealing film material, the problem of die shift of the light-emitting diode may be avoided. Furthermore, the disclosure adopts the Chip on Wafer (CoW) process to convert the light-emitting diode from on wafer e.g. sapphire wafer) to on panel (e.g. circuit board), so that multiple light-emitting diodes (in the form of panel) may be protected by the same protective casing. Compared with the general design that requires cutting into separate light-emitting diodes, and each separate light-emitting diode needs to be individually set up with a casing, the manufacturing method of the disclosure may make the distance between adjacent multiple light-emitting diodes smaller, resulting in more light-emitting diodes in the same unit area, and thus increasing the optical power output per unit area.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1 to FIG. 10 are schematic cross-sectional views of a manufacturing method of a light-emitting diode package structure according to an embodiment of the disclosure. According to this embodiment, a manufacturing method of a light-emitting diode package structure 10 is, for example, a fan-out panel level package (FONT) with die first/face up manufacturing method, and the manufacturing method of the light-emitting diode package structure 10 may include, but is not limited to, the following steps.

Figure 1:
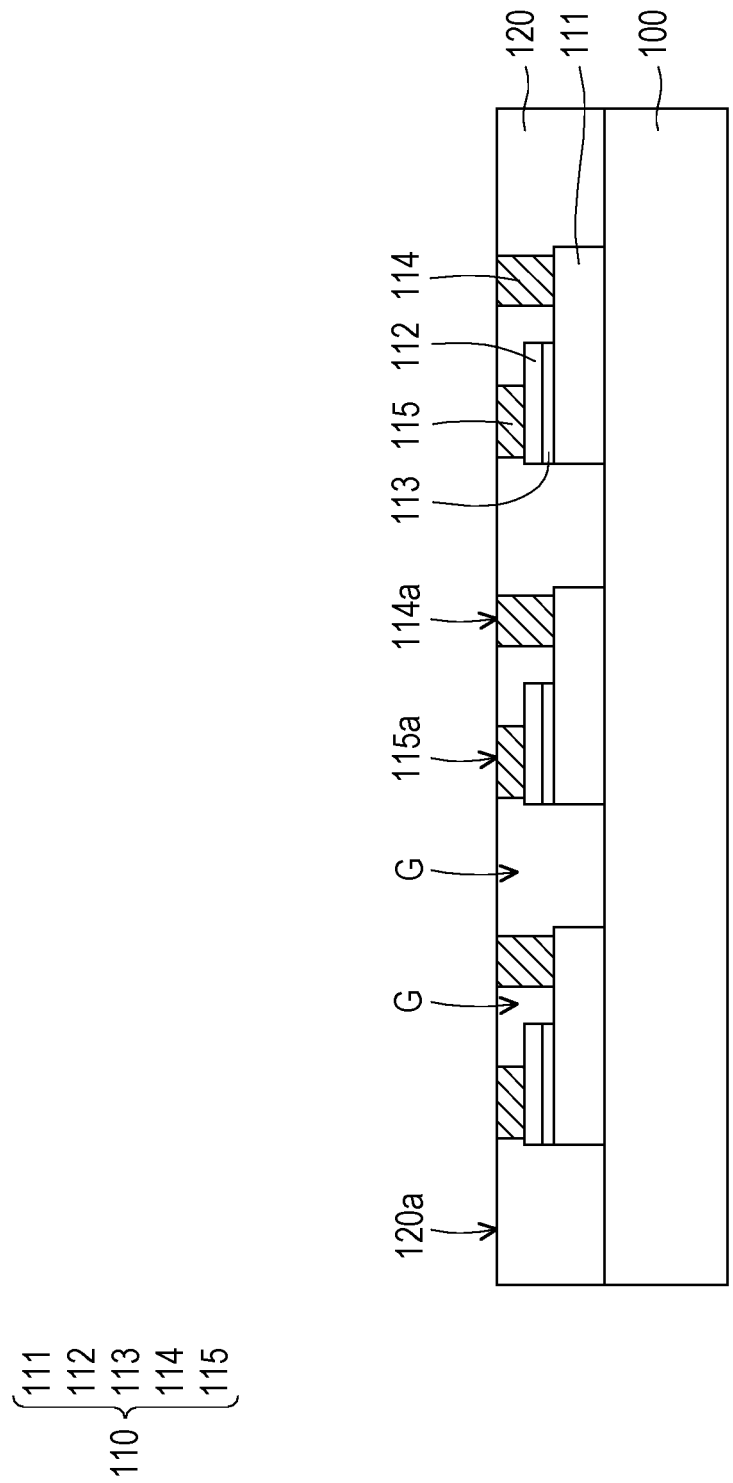
FIG. 1 to FIG. 10 are schematic cross-sectional views of a manufacturing method of a light-emitting diode package structure according to an embodiment of the disclosure.

First, referring to FIG. 1, multiple light-emitting diodes 110 are formed on a first temporary substrate 100. Specifically, the light-emitting diodes 110 are, for example, disposed on the first temporary substrate 100 in an array arrangement, but not limited thereto. The light-emitting diodes 110 may have an epitaxial laminated structure, epitaxially grown on the first temporary substrate 100, and includes a first type semiconductor layer 111 (e.g., an N-type semiconductor or a P-type semiconductor), a second type semiconductor layer 112 (e.g., a P-type semiconductor or an N-type semiconductor), and a light-emitting layer 113. The first type semiconductor layer 111 and the second type semiconductor layer 112 are respectively adjacent to two opposite sides of the light-emitting layer 113, and the first type semiconductor layer 111 is in contact with the first temporary substrate 100, The light-emitting diodes 110 further have a first electrode 114 and a second electrode 115. The first electrode 114 is electrically connected to the first type semiconductor layer 111, and the second electrode 115 is electrically connected to the second type semiconductor layer 112. The light-emitting diodes 110 according to this embodiment may be embodied as vertical light-emitting diodes, but not limited thereto. Here, the first temporary substrate 100 may be, for example, a sapphire wafer, but not limited thereto.

Next, a protective layer 120 is formed on the first temporary substrate 100 to fill a gap G between the light-emitting diodes 110, and to surround each of the light-emitting diodes 110. Specifically, the protective layer 120 may be disposed between the adjacent light-emitting diodes 110 (Which may also be regarded as a walkway between the adjacent light emitting diodes 110) and between the first electrode 114 and the second electrode 115 in the light emitting diodes 110. In addition, the protective layer 120 may expose a surface 114a of the first electrode 114 away from the first temporary substrate 100 and a surface 115a of the second electrode 115 away from the first temporary substrate 100 for subsequent electrical connection. According to this embodiment, a surface 120a of the protective layer 120 away from the first temporary substrate 100 is flush with the surface 114a of the first electrode 114 and the surface 115a of the second electrode 115. Here, a material of the protective layer 120 may be, for example, photoresist, spin-on-glass (SOG) material or other similar dielectric insulating materials, but not limited thereto. In addition, a thickness of the epitaxial laminated structure of the light-emitting diodes according to this embodiment may be, for example, less than 10 μm. According to other embodiments, the thickness of the epitaxial laminated structure of the light-emitting diodes may be, for example, between 5 μm and 7 μm, but not limited thereto.

Figure 2:
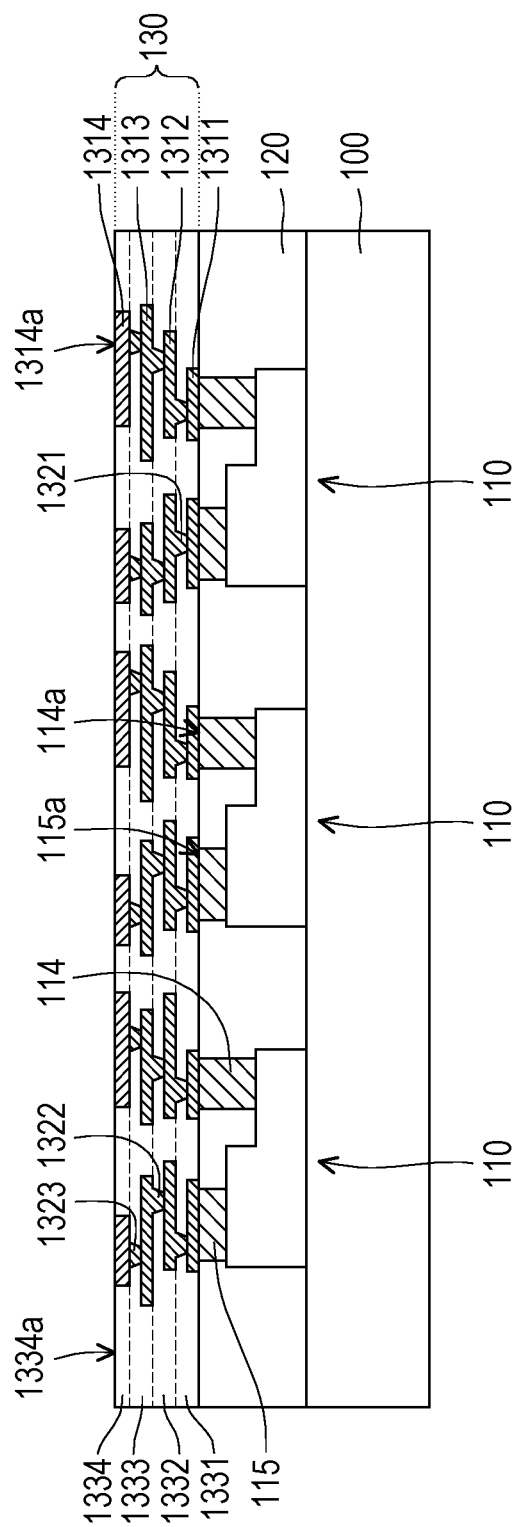

Next, referring to FIG. 2, a redistribution layer 130 is formed on the light-emitting diodes 110 to be electrically connected to the light-emitting diodes 110. According to this embodiment, the redistribution layer 130 may include patterned circuit layers 1311, 1312, 1313, and 1314, conductive through holes 1321, 1322, and 1323, and dielectric layers 1331, 1332, 1333, and 1334. In detail, the patterned circuit layer 1311 is disposed on the light-emitting diodes 110, and in contact with the surface 114a of the first electrode 114 and the surface 115a of the second electrode 115. The dielectric layer 1331 is disposed on the light-emitting diodes 110, and covers the protective layer 120 and the patterned circuit layer 1311, The patterned circuit layer 1312 is disposed on the dielectric layer 1331, and is electrically connected to the patterned circuit layer 1311 through the conductive through hole 1321 penetrating the dielectric layer 1331. The dielectric layer 1332 is disposed on the dielectric layer 1331, and covers the patterned circuit layer 1312. The patterned circuit layer 1313 is disposed on the dielectric layer 1332, and is electrically connected to the patterned circuit layer 1312 through the conductive through hole 1322 penetrating the dielectric layer 1332. The dielectric layer 1333 is disposed on the dielectric layer 1332, and covers the patterned circuit layer 1313. The patterned circuit layer 1314 is disposed on the dielectric layer 1333, and is electrically connected to the patterned circuit layer 1313 through the conductive through hole 1323 penetrating the dielectric layer 1333. The dielectric layer 1334 is disposed on the dielectric layer 1333, and adjacent to and exposes the patterned circuit layer 1314. In other words, a surface 1314a of the patterned circuit layer 1314 away from the light-emitting diodes 110 is flush with a surface 1334a of the dielectric layer 1334 away from the light-emitting diodes 110. The redistribution layer 130 according to this embodiment is formed by stacking four patterned circuit layers 1311, 1312, 1313, and 1314, three layers of conductive through holes 1321, 1322, and 1323, and four dielectric layers 1331, 1332, 1333, and 1334, but not limited thereto. According to other embodiments, a number of the patterned circuit layers, conductive through holes, and dielectric layers may be determined according to product requirements. Here, a material of the patterned circuit layers 1311, 1312, 1313, and 1314 and the conductive through holes 1321, 1322, and 1323 may be, for example, copper or other conductive metal materials, but not limited thereto. A material of the dielectric layers 1331, 1332, 1333, and 1334 may be aluminum nitride (AlN), boron nitride (BN) or other high-k insulating materials, but not limited thereto. Preferably, the dielectric layer 1331, 1332, 1333, and 1334 may be a plating layer with good heat dissipation, which may enhance a heat dissipation effect.

It should be noted that, according to this embodiment, after the light-emitting diodes 110 are formed on the first temporary substrate 100, the process of mass transfer and the process of using packaging gel may be omitted by manufacturing the redistribution layer 130 directly on the formed light-emitting diodes 110, thus making the manufacturing method according to this embodiment applicable to light-emitting diode packaging, avoiding the problem of die shift, and having an effect of simplifying the process.

Figure 3:
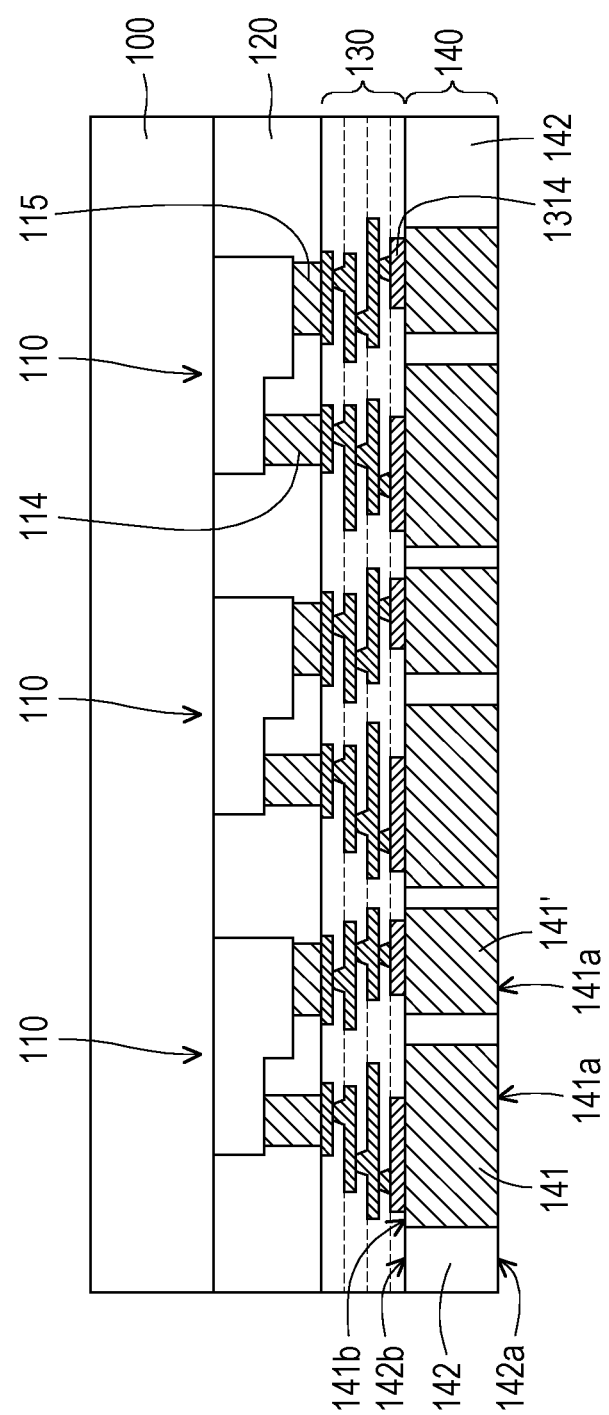

Next, referring to FIG. 3, a heat dissipation substrate 140 is formed on the redistribution layer 130. The heat dissipation substrate 140 includes multiple copper blocks 141 and 141' and a heat-conducting material layer 142. The copper blocks 141 and 141' penetrate the heat-conducting material layer 142. According to this embodiment, the forming of the heat dissipation substrate 140 may include, but is not limited to, the following steps. First, the copper blocks 141 and 141' are formed on the redistribution layer 130 to be connected to the corresponding patterned circuit layer 1314 respectively. Then, the heat-conducting material layer 142 is pressed between the copper blocks 141 and 141' on the redistribution layer 130, so that a thickness of the heat-conducting material layer 142 is substantially equal to a thickness of the copper blocks 141 and 141'. That is, a surface 142b of the heat-conducting material layer 142 facing the redistribution layer 130 is flush with a surface 141b of the copper blocks 141 and 141' facing the redistribution layer 130. A surface 142a of the heat-conducting material layer 142 away from the redistribution layer 130 is flush with a surface 141a of the copper blocks 141 and 141' away from the redistribution layer 130.

Specifically, the copper block 141 and the copper block 141' are separated from each other. The copper block 141 may be electrically connected to the first electrode 114 in the corresponding light-emitting diode 110 through the corresponding patterned circuit layers 1311, 1312, 1313, and 1314 and the corresponding conductive through holes 1321, 1322, and 1323 in the redistribution layer 130. The copper block 141' may be electrically connected to the second electrode 115 in the corresponding light-emitting diode 110 through the corresponding patterned circuit layers 1311, 1312, 1313, and 1314 and the corresponding conductive through hole 1321, 1322, and 1323 in the redistribution layer 130. Therefore, the copper block 141 may be regarded as an extension of the first electrode 114, and the copper block 141' may be regarded as an extension of the second electrode 115. This design not only avoids electrical short circuits, but also allows the heat generated by the light-emitting diodes 110 under high current operation to be quickly dissipated through the copper block 141, thus enhancing the overall heat dissipation efficiency.

According to this embodiment, the thickness of the copper blocks 141 and 141' (i.e., a vertical distance from the surface 141a to the surface 141b) may be, for example, from 1 µm to 200 µm, but not limited thereto. When the thickness of the copper blocks 141 and 141' is less than 1 µm, the heat dissipation effect may be affected. When the thickness of the copper blocks 141 and 141' is greater than 200 µm, the overall structure may be damaged due to excessive internal stress caused by the long manufacturing time of the copper blocks. In addition, a material of the heat-conducting material layer 142 is preferably an insulating material with high thermal conductivity, such as aluminum nitride (MN, the thermal conductivity may be, for example, 180 W/mK), silicon (Si, the thermal conductivity may be, for example, 140 W/mK), boron nitride (BN, the thermal conductivity may be, for example, 400 W/mK), diamond-like carbon layer ((DLC) layer, the thermal conductivity may be, for example, 410 W/mK) to further improve the overall heat dissipation efficiency, but not limited thereto.

Figure 4:
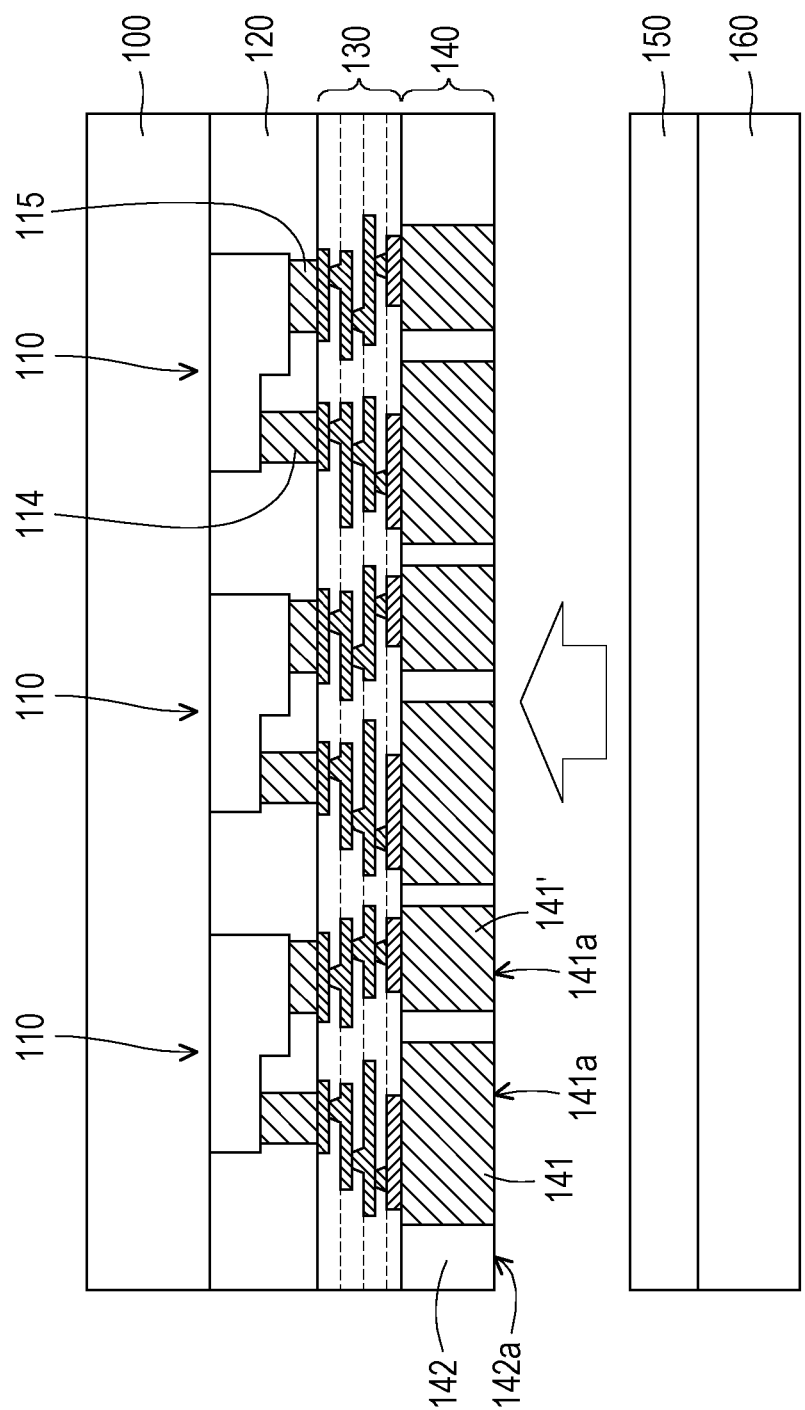

Next, referring to FIG. 4, a second temporary substrate 160 is disposed on a surface of the heat dissipation substrate 140 away from the redistribution layer 130 (i.e., the surface 141a and the surface 142a). Specifically, the second temporary substrate 160 may be attached to the heat dissipation substrate 140 through a temporary adhesive layer 150 to support the overall structure and facilitate the subsequent steps. Here, the second temporary substrate may be, for example, a glass substrate, a ceramic substrate, or other substrates with sufficient support, but not limited thereto. The temporary adhesion layer 150 may be, for example, a release layer, a thermal-release material, a light-to-heat-conversion (LTHC) release coating, ultraviolet glue, or other suitable materials, but not limited thereto. According to this embodiment, the temporary adhesive layer 150 may be formed on the second temporary substrate 160 by means of coating or laminating, but not limited thereto.

Figure 5:
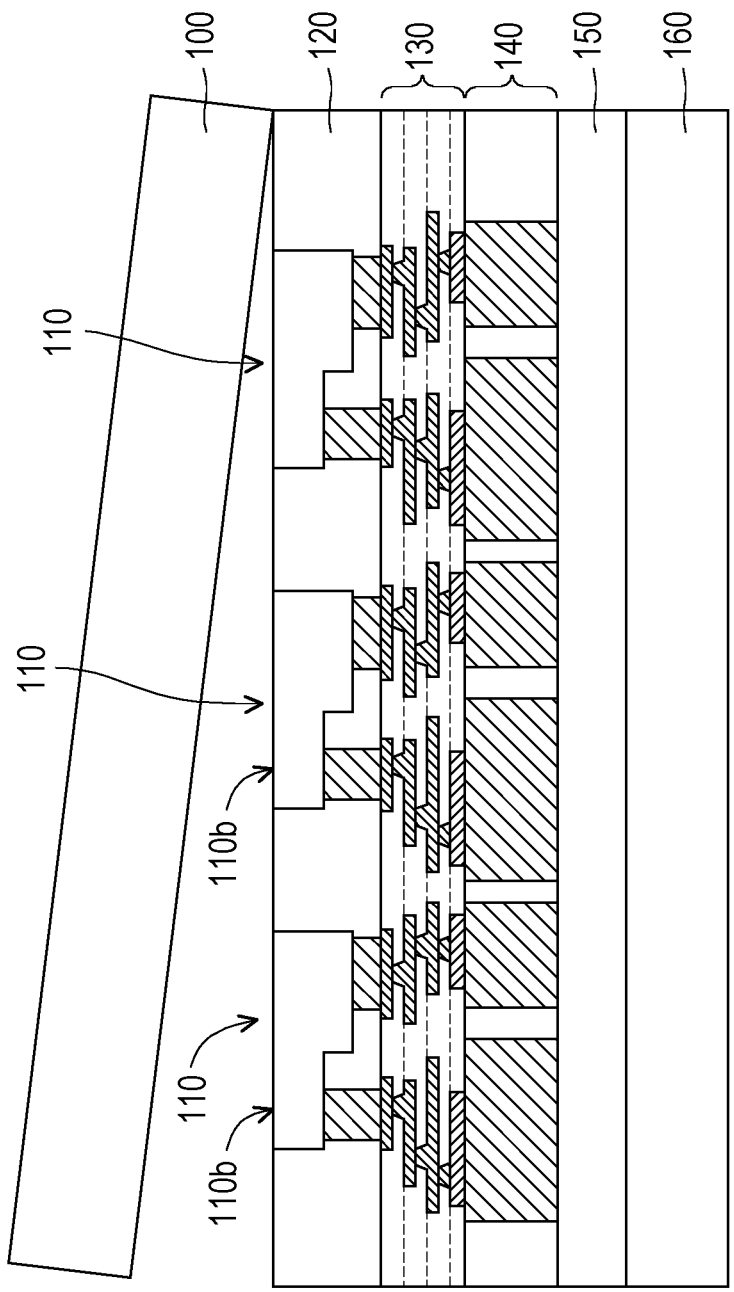

Next, referring to FIG. 5, the first temporary substrate 100 is removed to expose a surface 110b of the light-emitting diodes 110 away from the redistribution layer 130 (i.e., a surface of the first type semiconductor layer 111 in contact with the first temporary substrate 100). According to this embodiment, a laser-lift off process may be carried out to separate the first temporary substrate 100 (e.g., a sapphire substrate) by lasing and scanning a surface of the first temporary substrate 100 away from the light-emitting diodes 110, but not limited thereto.

Figure 6:
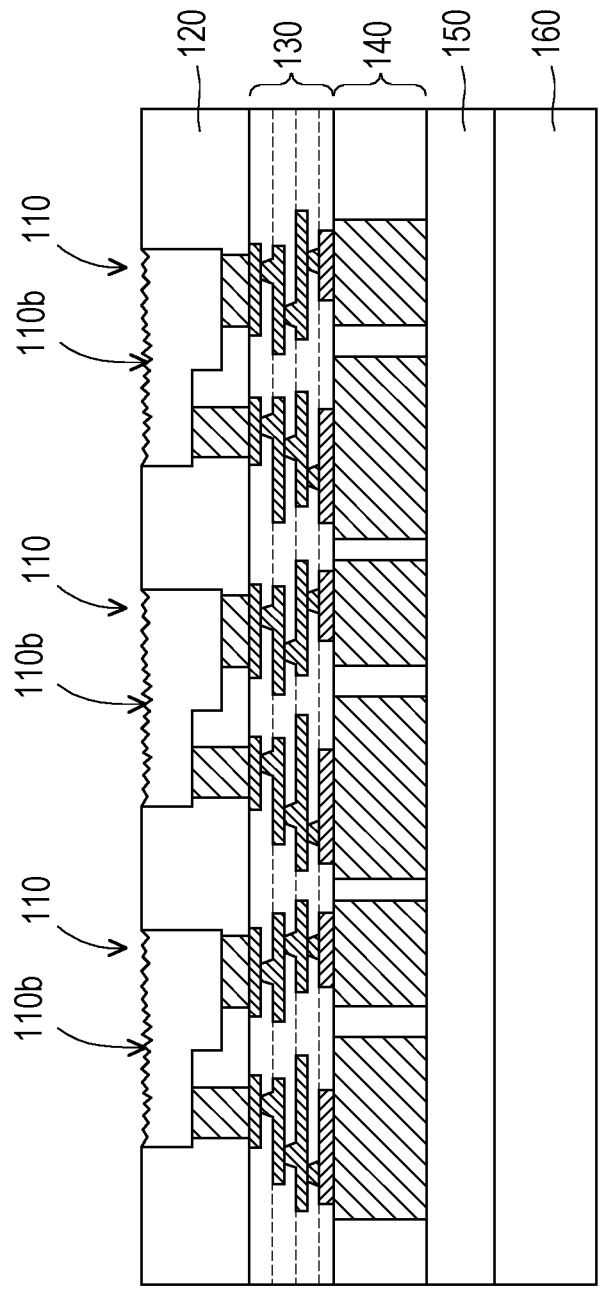

Next, referring to FIG. 6, the surfaces 110b of the light-emitting diodes 110 are roughened to increase a light extraction rate. Preferably, root mean square (RMS) roughness of the roughened surface is between 20 nm and 40 nm, for example, to have a better light extraction rate, but not limited thereto.

Figure 7:
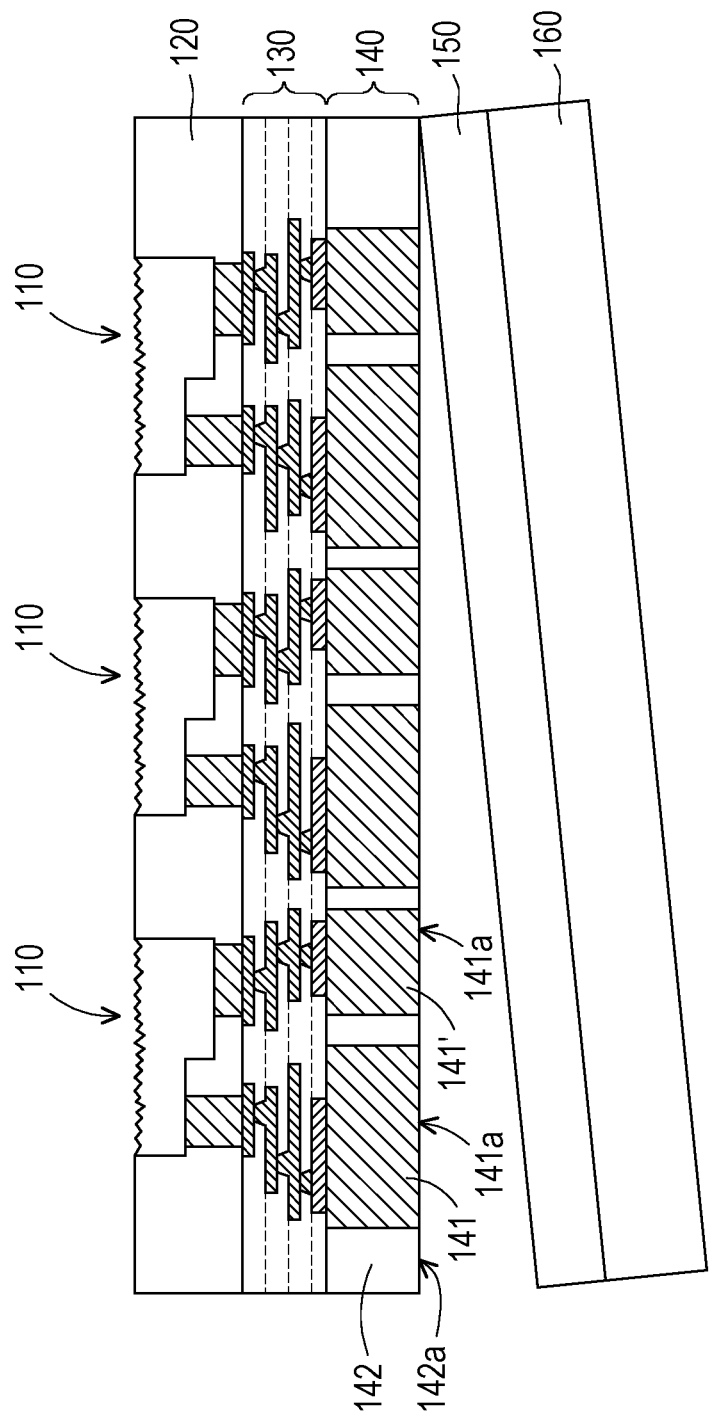

Next, referring to FIG. 7, the second temporary substrate 160 is removed to expose the surface of the heat dissipation substrate 140 (i.e., the surface 141a and the surface 142a). Specifically, the temporary adhesive layer 150 may be decomposed herein by illumination or heating to remove the second temporary substrate 160, but not limited thereto. Then, after the second temporary substrate 160 is removed, the heat dissipation substrate 150 may be used as a support for the overall structure to facilitate the subsequent steps.

Figure 8:
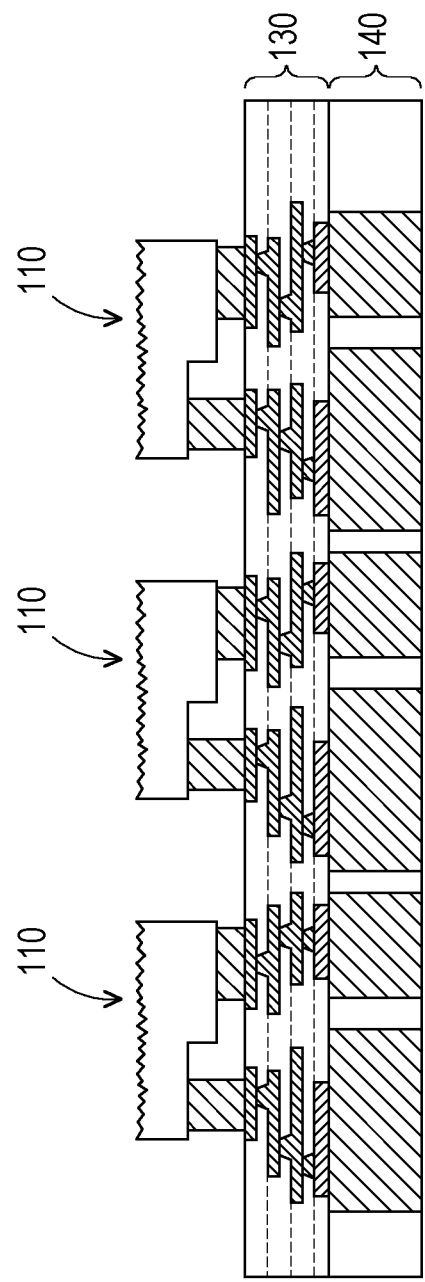

Next, referring to FIG. 7 and FIG. 8 at the same time, the protective layer 120 is removed. In particular, compared to the general process of sealing the light-emitting diodes with the packaging gel, according to this embodiment, by removing the protective layer 120, the light-emitting diodes 110 may be disposed on the redistribution layer 130 alone, and the design without contacting the packaging gel may avoid light emitted from the light-emitting diodes 110 being absorbed by the packaging gel, which may further improve the light emitting efficiency per unit area of the light-emitting diodes 110.

Figure 9:
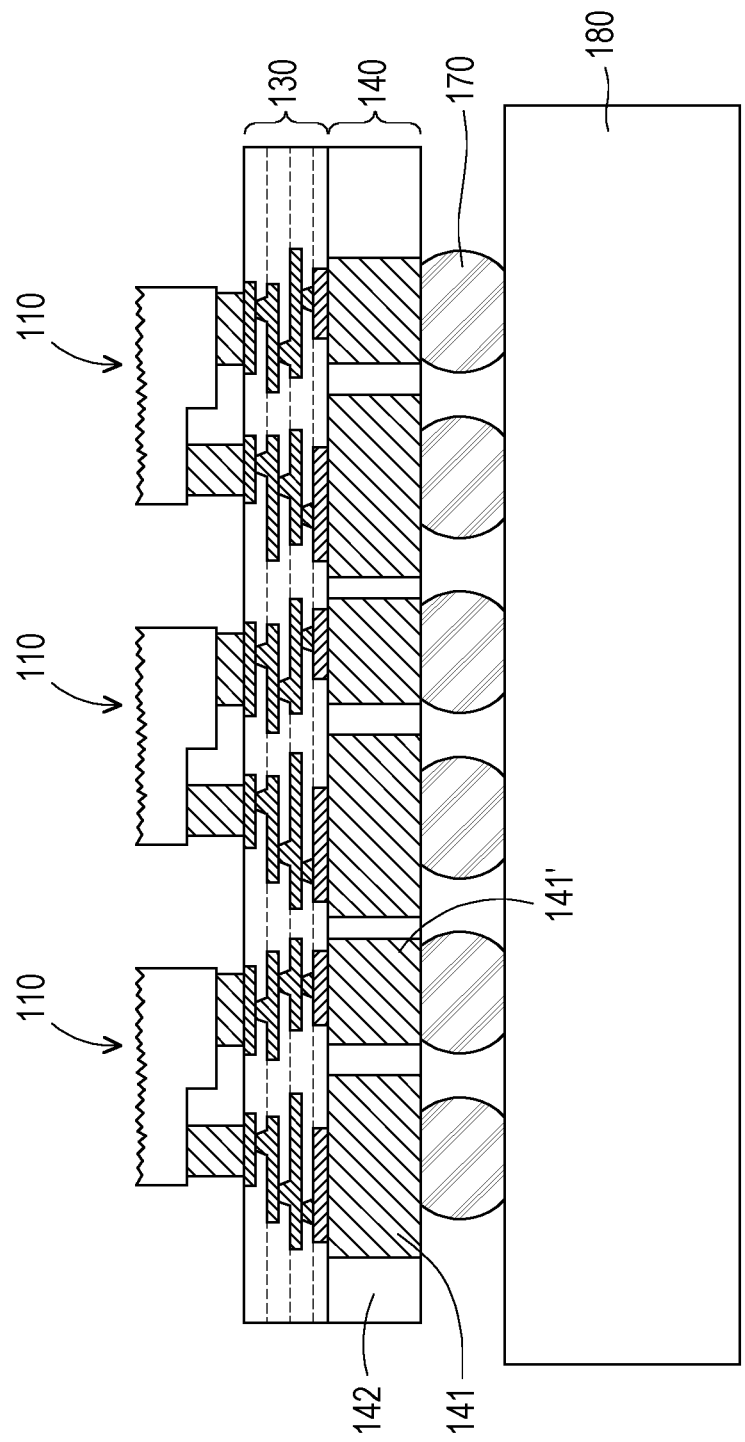

Next, referring to FIG. 9, a circuit board 180 is provided to bond the heat dissipation substrate 140 to the circuit board 180, and to electrically connect the redistribution layer 130 to the circuit board 180 through the copper blocks 141. Specifically, the circuit board 180 is disposed on the surface of the heat dissipation substrate 140 away from the redistribution layer 130. Then, multiple conductive terminals 170 are formed between the heat dissipation substrate 140 and the circuit board 180 to connect the copper blocks 141 and 141' and the circuit board 180. According to this embodiment, the conductive terminals 170 may be, for example, solder balls, but not limited thereto.

Figure 10:
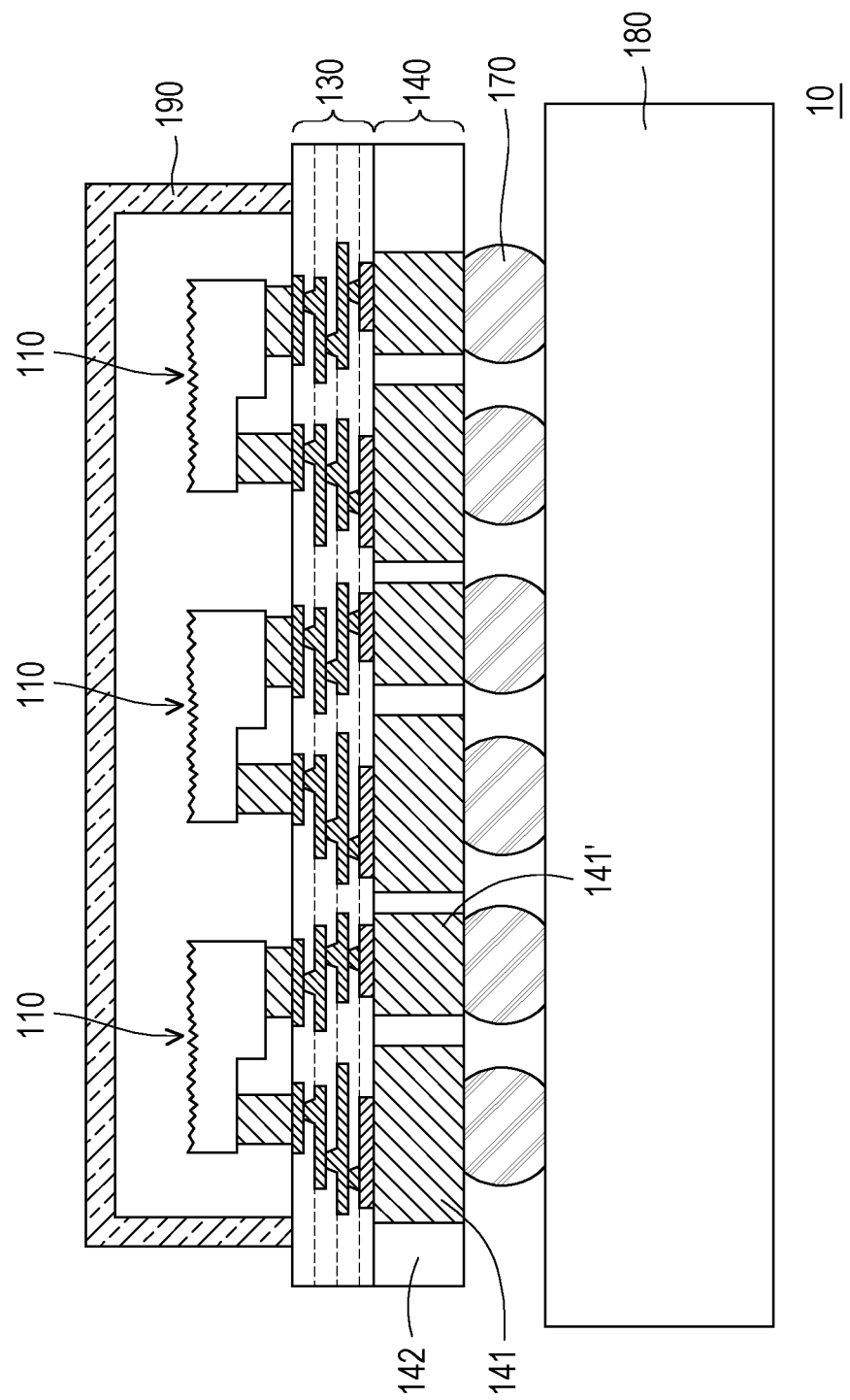

Next, referring to FIG. 10, a protective casing 190 is formed on the redistribution layer 130 to cover the light-emitting diodes 110. The protective casing 190 is not in contact with the light-emitting diodes 110. According to this embodiment, the protective casing 190 is completely surrounded to seal the light-emitting diodes 110, so that the light-emitting diodes 110 may be isolated from the outside world, and a side of the light-emitting diodes 110 away from the redistribution layer 130 is not in contact with any component, which may further prevent the light-emitting diodes 110 from contacting moisture or causing damage to the light-emitting diodes 110 due to collisions and other situations. Here, the protective casing 190 may be, for example, a glass casing or other suitable materials, but not limited thereto. At this point, the manufacture of the light-emitting diode package structure 10 has been substantially completed.

In particular, as shown in FIG. 4 to FIG. 10, this embodiment adopts the Chip on Wafer (CoW) process. The light-emitting diode 110 is transferred from the first temporary substrate 100 (i.e., a wafer, e.g., a sapphire wafer) to the circuit board 180 (i.e., a panel without a pick-and-place process. Compared with the original method of cutting into separate light-emitting diodes and disposing the light-emitting diodes on the circuit board through a pick-and-place process, the manufacturing method of the disclosure may make the distance between adjacent light-emitting diodes 110 smaller, resulting in more light-emitting diodes 110 in the same unit area, and thus increasing the optical power output per unit area. In addition, compared with the conventional design in which each separate light-emitting diode needs to be individually set up with a package casing, the light-emitting diodes 110 (in the form of panel) according to this embodiment may be protected by the same protective casing 190. Furthermore, the light-emitting diodes 110 without a native epitaxy substrate (e.g., sapphire wafer) may significantly reduce an overall thickness (a thickness with the native epitaxy substrate may be, for example, more than 50 μm, and a thickness without the native epitaxy substrate may be, for example, less than 7 μm).

In short, a light-emitting diode package structure 10 of the disclosure includes a heat dissipation substrate 140, a redistribution layer 130, and multiple light-emitting diodes 110. The heat dissipation substrate 140 includes multiple copper blocks 141 and 141' and a heat-conducting material layer 142. The copper blocks 141 and 141' penetrate the heat-conducting material layer 142. The redistribution layer 130 is disposed on the heat dissipation substrate 140 and is electrically connected to the copper blocks 141 and 141'. The light-emitting diodes 110 are disposed on the redistribution layer 130 and electrically connected to the redistribution layer 130. A side of the light-emitting diodes 110 away from the redistribution layer 130 is not in contact with any component.

In summary, in the light-emitting diode package structure and the manufacturing method thereof according to an embodiment of the disclosure, by disposing the heat dissipation substrate between the redistribution layer and the circuit hoard, the heat generated by the light-emitting diode under high current operation may be quickly dissipated through the heat dissipation substrate to enhance the overall heat dissipation efficiency. In addition, because the manufacturing method according to this embodiment does not have the step of mass transfer and sealing film material, the problem of die shift of the light-emitting diode may be avoided. In addition, by removing the protective layer and other packaging gel, the light emitted by the light-emitting diodes may be avoided from being absorbed by the protective layer, and the light-emitting efficiency may be improved. Moreover, by adopting the Chip on Wafer (CoW) process, the distance between adjacent light-emitting diodes is smaller, resulting in more light-emitting diodes in the same unit area, and thus increasing the optical power output per unit area. Furthermore, since the light-emitting diodes do not have a native epitaxy substrate, the overall thickness of the light-emitting diode package structure may be greatly reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a light-emitting diode package structure comprising:

forming a plurality of light-emitting diodes on a first temporary substrate;

forming a redistribution layer on the light-emitting diodes to be electrically connected to the light-emitting diodes; and forming a heat dissipation substrate on the redistribution layer, wherein the heat dissipation substrate comprises a plurality of copper blocks and a heat-conducting material layer, and the copper blocks penetrate the heat-conducting material layer and are electrically connected to the redistribution layer, wherein a side of the light-emitting diodes away from the redistribution layer is not in contact with any component, wherein before forming the redistribution layer on the light-emitting diodes further comprises:

forming a protective layer on the first temporary substrate to fill a gap between the light-emitting diodes, and to surround each of the light-emitting diodes.

2. The manufacturing method according to claim 1 further comprising:

forming a protective casing on the redistribution layer to cover the light-emitting diodes, wherein the protective casing is not in contact with the light-emitting diodes.

3. The manufacturing method according to claim 1 further comprising:
- providing a circuit board to bond the heat dissipation substrate to the circuit board, and to electrically connect the redistribution layer to the circuit board through the copper blocks; and
- forming a plurality of conductive terminals between the heat dissipation substrate and the circuit board to connect the copper blocks and the circuit board.

4. The manufacturing method according to claim 3, wherein before providing the circuit board further comprises:
- disposing a second temporary substrate on a surface of the heat dissipation substrate away from the redistribution layer;
- removing the first temporary substrate to expose a surface of the light-emitting diodes away from the redistribution layer;
- removing the second temporary substrate to expose the surface of the heat dissipation substrate; and
- removing the protective layer.

5. The manufacturing method according to claim 4, wherein before removing the second temporary substrate further comprises:
- roughening the surface of the light-emitting diodes.

* * * * *